US007830212B2

(12) United States Patent
Lee et al.

(10) Patent No.: US 7,830,212 B2
(45) Date of Patent: Nov. 9, 2010

(54) PHASE LOCKED LOOP, VOLTAGE CONTROLLED OSCILLATOR, AND PHASE-FREQUENCY DETECTOR

(75) Inventors: Jri Lee, Taipei (TW); Ming-Chung Liu, Taipei (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 9 days.

(21) Appl. No.: 12/145,247

(22) Filed: Jun. 24, 2008

(65) Prior Publication Data
US 2009/0033381 A1 Feb. 5, 2009

Related U.S. Application Data

(60) Provisional application No. 60/952,609, filed on Jul. 30, 2007.

(51) Int. Cl.
*H03B 5/12* (2006.01)
(52) U.S. Cl. .................. 331/36 L; 331/107 SL; 331/167
(58) Field of Classification Search .............. 331/36 L, 331/107 SL, 167
See application file for complete search history.

(56) References Cited

U.S. PATENT DOCUMENTS

2007/0026816 A1* 2/2007 Heidari et al. .......... 455/76
2008/0164955 A1* 7/2008 Pfeiffer et al. .......... 331/117 R

FOREIGN PATENT DOCUMENTS

CN 1992528 7/2007

OTHER PUBLICATIONS

IEEE Journal of Solid-State Circuits, vol. 41, No. 1, Jan. 2006, "A 60-GHz CMOS Receiver Front-End", Behzad Razavi, Fellow, IEEE.
ISSCC 2004 / Session 24 / TD: Wireless Trends: Low-Power and 60GHZ / 24.4, "Design of CMOS for 60GHz Applications" Chinh H. Doan et al.
IEEE Journal of Solid-State Circuits, vol. 41, No. 5, May 2006, "High-Speed Circuit Designs for Transmitters in Broadband Data Links" Jri Lee, Member IEEE.
ISSCC 2006/Session 32/ PLLs, VCOs, and Dividers/ 32.8, "70GHz CMOS Harmonic Injection-Locked Divider" Ken Yamamoto et al.
ISSCC 2006/Session 32/PLLs, VCOs, and Dividers/ 32.7, "A Combined Dynamic and Static Frequency Divider for a 40GHz PLL in 80nm CMOS," George Von Buren et al.

(Continued)

*Primary Examiner*—Robert Pascal
*Assistant Examiner*—James E Goodley
(74) *Attorney, Agent, or Firm*—Thomas, Kayden, Horstemeyer & Risley

(57) ABSTRACT

A phase locked loop, voltage controlled oscillator, and phase-frequency detector are provided. The phase locked loop comprises a phase-frequency detector (PFD), a loop filter (LF), a voltage controlled oscillator (VCO), and a 3-stage frequency divider. The PFD receives a reference signal and a feedback signal to determine phase and frequency errors. The LF), coupled to the phase-frequency detector, filters the phase and frequency errors to generate a control voltage. The VCO, coupled to the loop filter, generates a VCO output signal according to the control voltage. The 3-stage frequency divider, coupled to the voltage controlled oscillator, divides the frequency of the VCO output signal 3 times to generate the feedback signal.

13 Claims, 17 Drawing Sheets

OTHER PUBLICATIONS

IEEE Journal of Solid-State Circuits, vol. 39, No. 4, Apr. 2004, "A 40-GHz Frequency Divider in 0.18-µm CMOS Technology" Jri Lee et al.

IEEE Journal of Solid-State Circuits, vol. 38, No. 12, December, "A 40-Gb/s Clock and Data Recovery Circuit in 0.18-µm CMOS Technology," Jri Lee et al.

IEEE Journal of Solid-State Circuits, vol. 38, No. 11, Nov. 2003, "A Low-Power Adaptive Bandwidth PLL and Clock Buffer With Supply-Noise Compensation" Mozhgan Mansuri et al.

ISSCC 2001/ Session 26/ Wireless Building Blocks II/ 26.3, "A 19GHz 0.5mW 0.35µm CMOS Frequency Divider with Shunt-Peaking Locking-Range Enhancement" Hui Wu et al.

IEEE Journal of Solid State Circuits, vol. 36, No. 11, Nov. 2001, "A Low-Jitter 125-1250-MHz Process-Independent and Ripple-Poleless 0.18µm CMOS PLL Based on a Sample-Reset Loop Filter" Adrian Maxim et al.

2005 Symposium on VLSI Circuits Digest of Technical Papers, "A 20-GHz Phase-Locked Loop for 40Gb/s Serializing Transmitter in 0.13µm CMOS" Jaeh Kim et al.

IEEE Journal of Solid-State Circuits, vol. 41, No. 4, Apr. 2006, A 20-GHz Phase-Locked Loop for 40-GB/s Serializing Transmitter in 0.13-µm CMOS Jaeha Kim et al.

IEEE Journal of Solid-State Circuits, vol. 39, No. 11, Nov. 2004, "A 2.5-10-GHz Clock Multiplier Unit With 0.22-ps RMS Jitter in Standard 0.18-µm CMOS" Remco C. H. Van De Beek et al.

ISSCC 2006/ Session 32/ PLLs, VCOs, and Dividers/32.5, "A 6.25GHz 1V LC-PLL in 0.13µm CMOS" Richard Gu et al.

ISSCC 2005/Session 8/ Circuits for High-Speed Links and Clock-Generators/8.5, "A 1V 24GHz 17.5mW PLL in 0.18µm CMOS" Alan W.L. Ng et al.

IEEE/1991, "Fast Acquisition Frequency Synthesizer with the Multiple Phase Detectors" Duk-Kyu Park et al.

ISSCC 2006/ Session 32/ PLLs, VCOs, and Dividers/ 32.4, "A Spur Suppression Technique for Phase-Locked Frequency Synthesizers" Tai-Cheng Lee et al.

ISSCC 2005/Session 21/ TD: RF Trends: Above-IC Integration and MM-Wave/21.9, "Fully Integrated BiCMOS PLL for 60 GHz Wireless Applications" Wolfgang Winkler et al.

IEEE Journal of Solid-State Circuits, vol. 41, No. 5, May 2006, "A Fully V-Band PLL MMIC Using 0.15-µm GaAs pHEMT Technology" Jinho Jeong et al.

English language translation of abstract of CN 1992528 (published Jul. 4, 2007).

* cited by examiner

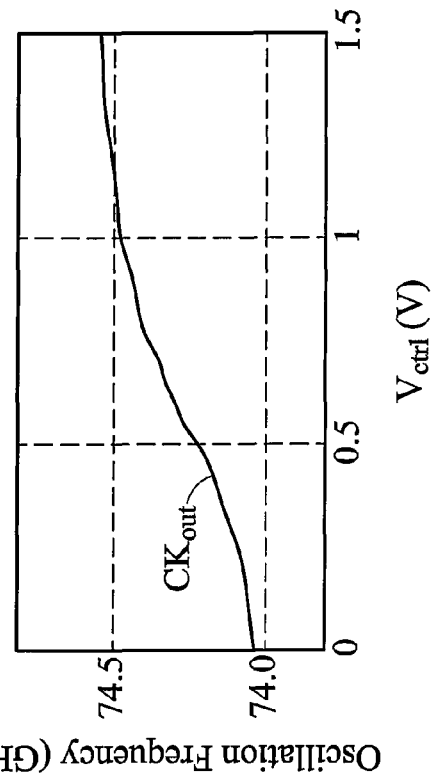
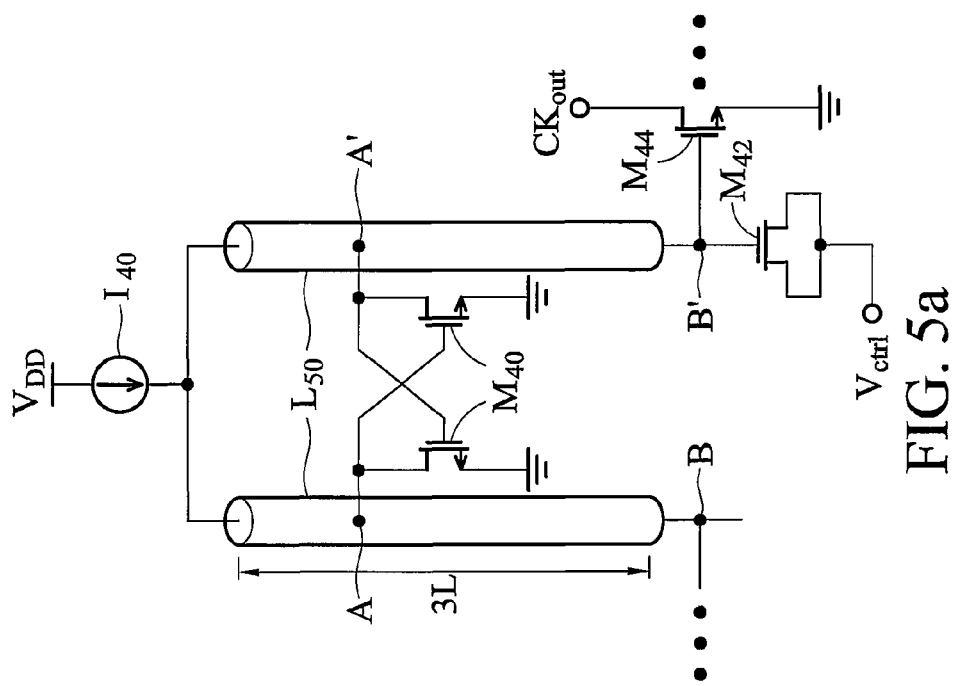
FIG. 5b
FIG. 5a

PHASE LOCKED LOOP, VOLTAGE CONTROLLED OSCILLATOR, AND PHASE-FREQUENCY DETECTOR

CROSS REFERENCE

This application claims the benefit of U.S. provisional application Ser. No. 60/952,609 filed Jul. 30, 2007, the subject matter of which is incorporated herein by reference.

BACKGROUND OF THE INVENTION

1. Field of the Invention

The invention relates in general to electronic circuits, and in particular, to electronic circuits of phase locked loops (PLL), voltage controlled oscillators (VCO), and phase-frequency detectors (PFD).

2. Description of the Related Art

As device size scales down, CMOS devices are achieving higher operating speeds. The low power consumption and high circuit integration of miniaturized devices, along with the improvement of broadband techniques, make CMOS technology attractive in realizing ultra-fast phase locked loop (PLL) circuits.

FIG. 1 is a block diagram of a conventional PLL, comprising phase-frequency detector 10, charge pump circuit 12, voltage controlled oscillator (VCO) 14, and divider 16. Phase-frequency detector 10 is coupled to charge pump circuit 12, voltage controlled oscillator (VCO) 14, and divider 16, and back to phase-frequency detector 10 in a loop.

Phase-frequency detector 10 compares reference signal $CK_{in}$ with a feedback signal to determine a phase and frequency error therebetween to charge or discharge charge pump circuit 12. The accumulated charges in charge pump circuit 12 produce a control voltage to VCO 14 to generate clock signal $CK_{out}$. Divider 16 receives clock signal $CK_{out}$ to perform a frequency division thereon to generate the feedback signal to phase-frequency detector 10 for phase and frequency error detection.

A number of considerations are taken into account for a PLL system, for example, parasitic capacitance in the PLL circuit may cause frequency shift of signals in the VCO or frequency divider to prevent the PLL from locking. Spurs in the reference signal also present an issue for conventional charge pump PLLs, where pulse-width comparison is performed in the phase detector, leading to interference problems to adjacent transmission channels. The reference clock feedthrough for conventional charge pump PLLs has always been an issue, wherein attempts have been made to minimize the reference spurs by: a charge transfer technique to spread out the momentary signal surge over a period; an analog phase detector using current-mode logic to reduce swing; a compensated charge-pump design to balance the device mismatch; and a distributed phase detector to avoid abrupt changes on the control voltage. However, none of the approaches eliminates pulse generation, so the control line ripple is never entirely removed.

Thus, a need exists for phase locked loop, voltage controlled oscillators (VCO), and phase-frequency detectors (PFD) to provide a high-speed and low-noise clock signal.

BRIEF SUMMARY OF THE INVENTION

A detailed description is given in the following embodiments with reference to the accompanying drawings.

A phase locked loop is provided, comprising a phase-frequency detector (PFD), a loop filter (LF), a voltage controlled oscillator (VCO), and a 3-stage frequency divider. The PFD receives a reference signal and a feedback signal to determine phase and frequency errors. The LF, coupled to the phase-frequency detector, filters the phase and frequency errors to generate a control voltage. The VCO, coupled to the loop filter, generates a VCO output signal according to the control voltage. The 3-stage frequency divider, coupled to the voltage controlled oscillator, divides the frequency of the VCO output signal 3 times to generate the feedback signal.

According to another embodiment of the invention, a voltage controlled oscillator is provided, comprising a transmission line pair, a cross-coupled transistor pair, and a varactor. The transmission line pair has a length, short-circuited at one end pair and open-circuited at the other end pair, provides a VCO output signal with an initial VCO wavelength. The cross-coupled transistor pair is coupled to one third of the length of the transmission line pair from the short circuited end pair. The varactor, coupled to the open-circuited ends of the transmission line pair, adjusts the initial VCO wavelength of the VCO output signal according to a control voltage to a final VCO wavelength. The length of the transmission line pair is three quarter of the initial VCO wavelength.

According to another embodiment of the invention, a phase-frequency detector is provided, comprising a phase detector and a frequency detector. The phase detector receives orthogonal signal pairs of a reference signal and a feedback signal, and comprises a first PD multiplier, a second PD multiplier, and a PD adder. The first PD multiplier multiplies the quadrature signal of the reference signal with the in-phase signal of the feedback signal to generate a first multiplication output. The second PD multiplier multiplies the in-phase signal of the reference signal with the quadrature signal of the feedback signal to generate a second multiplication output. The PD adder, coupled to the first and second PD multipliers, adds the first multiplication output with a negation of the second multiplication output to generate a phase error. The frequency detector receives the orthogonal signal pairs of the reference signal and the feedback signal and the phase error, and comprises a first FD multiplier, a second FD multiplier, an FD adder, and a flip-flop. The first FD multiplier multiplies the in-phase signal of the reference signal with the in-phase signal of the feedback signal to generate a third multiplication output. The second FD multiplier multiplies the quadrature signal of the reference signal with the quadrature signal of the feedback signal to generate a fourth multiplication output. The FD adder, coupled to the third and fourth PD multipliers, adds the first multiplication output with the second multiplication output to generate a SSB output. The flip-flop, coupled to the first and second FD adders, latches the phase error with the SSB output to generate an FD error.

BRIEF DESCRIPTION OF THE DRAWINGS

The invention can be more fully understood by reading the subsequent detailed description and examples with references made to the accompanying drawings, wherein:

FIG. 4b shows the relationship of Vctrl and the output frequency of VCO output signal $CK_{OUT}$, incorporating the VCO in FIG. 4a.

FIG. 5a is a circuit schematic of another exemplary VCO according to the invention.

FIG. 5b shows the relationship of control voltage $V_{ctrl}$ and the output frequency of VCO output signal $CK_{OUT}$, incorporating the VCO in FIG. 5a.

FIG. 6 shows a layout arrangement of a ground shield for the inductor in the VCO in FIG. 5a.

FIGS. 7b and 7c show the relationship of supply voltage VDD and drain currents $I_{SS}$ and $I_C$, and the oscillation frequency of the VCO in FIG. 7a.

FIG. 10b depicts the relationship of phase detector voltage VPD and error θ, incorporating the phase detector in FIG. 10a.

FIG. 10c is a circuit schematic of an exemplary phase detector in FIG. 10a.

FIG. 12b shows the relationship of input voltage $V_{in}$ and output voltage $V_{out}$ for the phase detector in FIG. 10a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
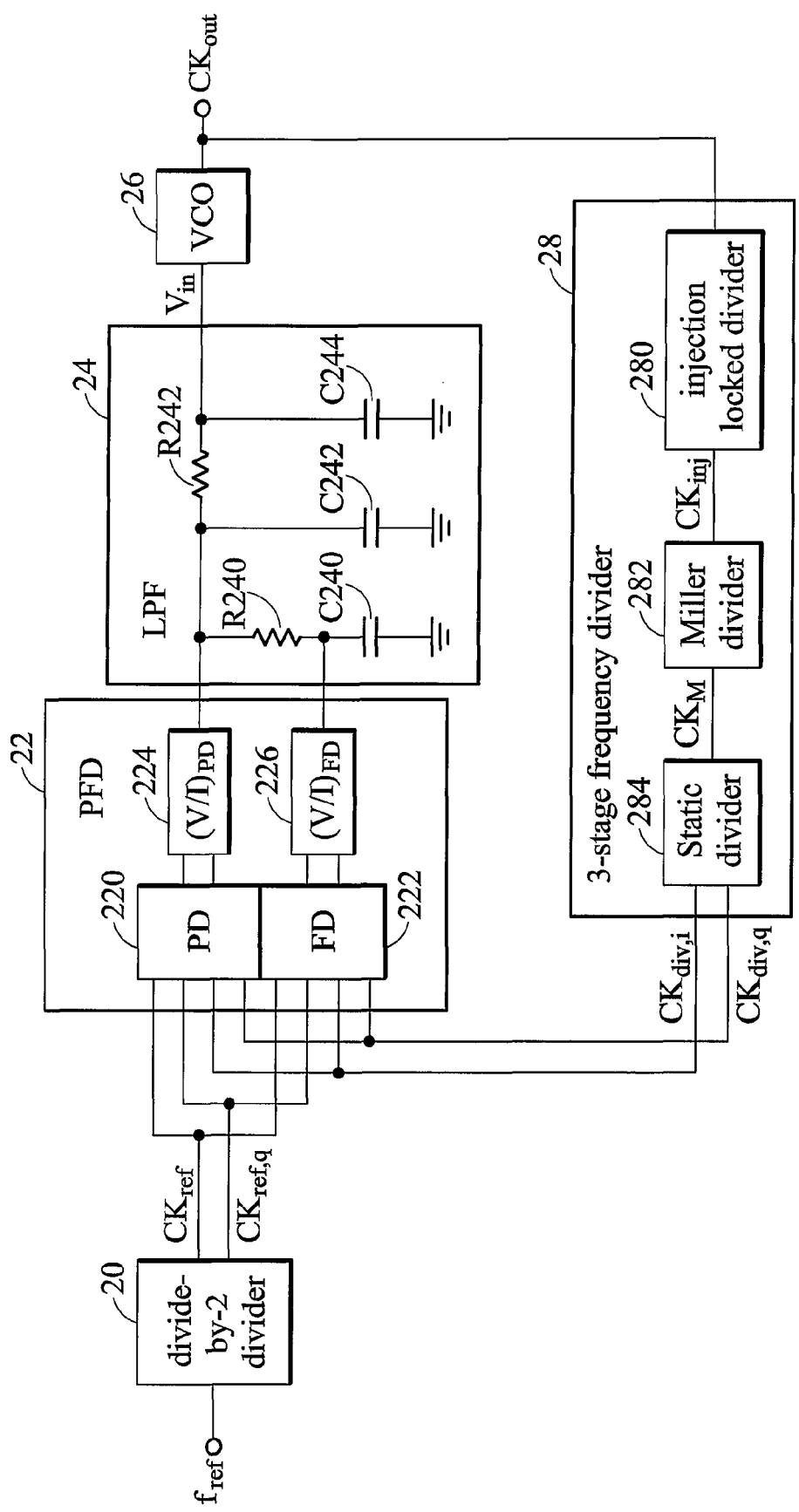
FIG. 2 is a block diagram of an exemplary Phase-Locked Loop (PLL) according to the invention.

FIG. 2 is a block diagram of an exemplary Phase-Locked Loop (PLL) according to the invention, comprising divide-by-2 divider 20, phase-frequency detector (PFD) 22, loop filter 24, voltage controlled oscillator (VCO) 26, and 3-stage frequency divider 28. Divide-by-2 divider 20 is coupled to phase-frequency detector 22. Phase-frequency detector 22, loop filter 24, voltage controlled oscillator 26, and 3-stage frequency divider 28 are coupled in a loop.

PLL 2 is implemented to produce a clock signal with low jitter and wide operating range. Divide-by-2 divider 20 provides quadrature reference inputs $CK_{ref,i}$, $CK_{ref,q}$. Phase-frequency detector 22 receives reference signals $CK_{ref,i}$, $CK_{ref,q}$ and feedback signals $CK_{div,i}$, $CK_{div,q}$ to determine phase and frequency errors. Loop filter 24 then filters the phase and frequency errors to generate control voltage $V_{ctrl}$. Voltage controlled oscillator 26 generates VCO output signal $CK_{out}$ according to the control voltage $V_{ctrl}$. And 3-stage frequency divider 28 divides the frequency of VCO output signal $CK_{out}$ 3 times to generate feedback signals $CK_{div,i}$, $CK_{div,q}$.

Phase-frequency detector 22 comprises phase detector (PD) 220, frequency detector (FD), PD voltage-to-current converter 224, and FD voltage-to-current converter 226. Phase-frequency detector 22 may be implemented with the conventional charge pump circuit configuration, or SSB (single sideband) mixers and low-pass filters to suppress the reference feedthrough. Frequency detector 222 and FD voltage-to-current converter 226 estimates the frequency error between reference signals $CK_{ref,i}$, $CK_{ref,q}$ and feedback signals $CK_{div,i}$, $CK_{div,q}$, and converts the frequency error signal to a current. Note that both are turned off upon frequency lock to reduce the disturbance to the VCO. Phase detector 220 and PD voltage-to-current converter 224 estimates the phase error between reference signals $CK_{ref,i}$, $CK_{ref,q}$ and feedback signals $CK_{div,i}$, $CK_{div,q}$, and converts the phase error to a current, running continuously throughout the PLL operation. Frequency detector 222 and FD voltage-to-current converter 226 perform dominant coarse adjustment on control voltage Vctrl, while phase detector 220 and PD voltage-to-current converter 224 provides fine adjustment thereon.

Loop filter 24 comprises resistors R240 through R242, and capacitors C240 through C244. Loop filter 24 is realized on an integrated circuit to minimize the noise coupling through bonding wires. 9-layer interconnect metals in 90-nm process may be utilized for provision of high density fringe capacitors, reducing circuit size of loop filter 24 to 100×300 $\mu m^2$.

3-stage frequency divider 28 comprises injection locked divider 280, Miller divider 282, and static divider 284. Injection locked divider 280 is coupled to Miller divider 282, and then to static divider 284. 3-stage frequency divider 28 performs three frequency divisions on VCO output signal $CK_{OUT}$ to derive feedback signals $CK_{div,i}$, $CK_{div,q}$. To accommodate the tradeoffs between the input frequency and operating range, several divider types are employed in 3-stage frequency divider 28. Generally speaking, the injection-locked dividers provide the highest operating frequency due to the simple structure, but also the narrowest locking range. Static dividers, on the other hand, reveal a relatively wide range of operation, but only at low frequencies. Miller dividers, also known as regenerative dividers, provide a compromise between the injection-locked and Miller frequency dividers, generating an output signal with median locking range with moderate center frequency. As a result, 24 cascades the three types of frequency dividers in descending order of operating frequencies, i.e., the injection-locked, Miller, and then static dividers, to provide a low operating frequency and wide locking range for the feedback signal.

Figure 3A:
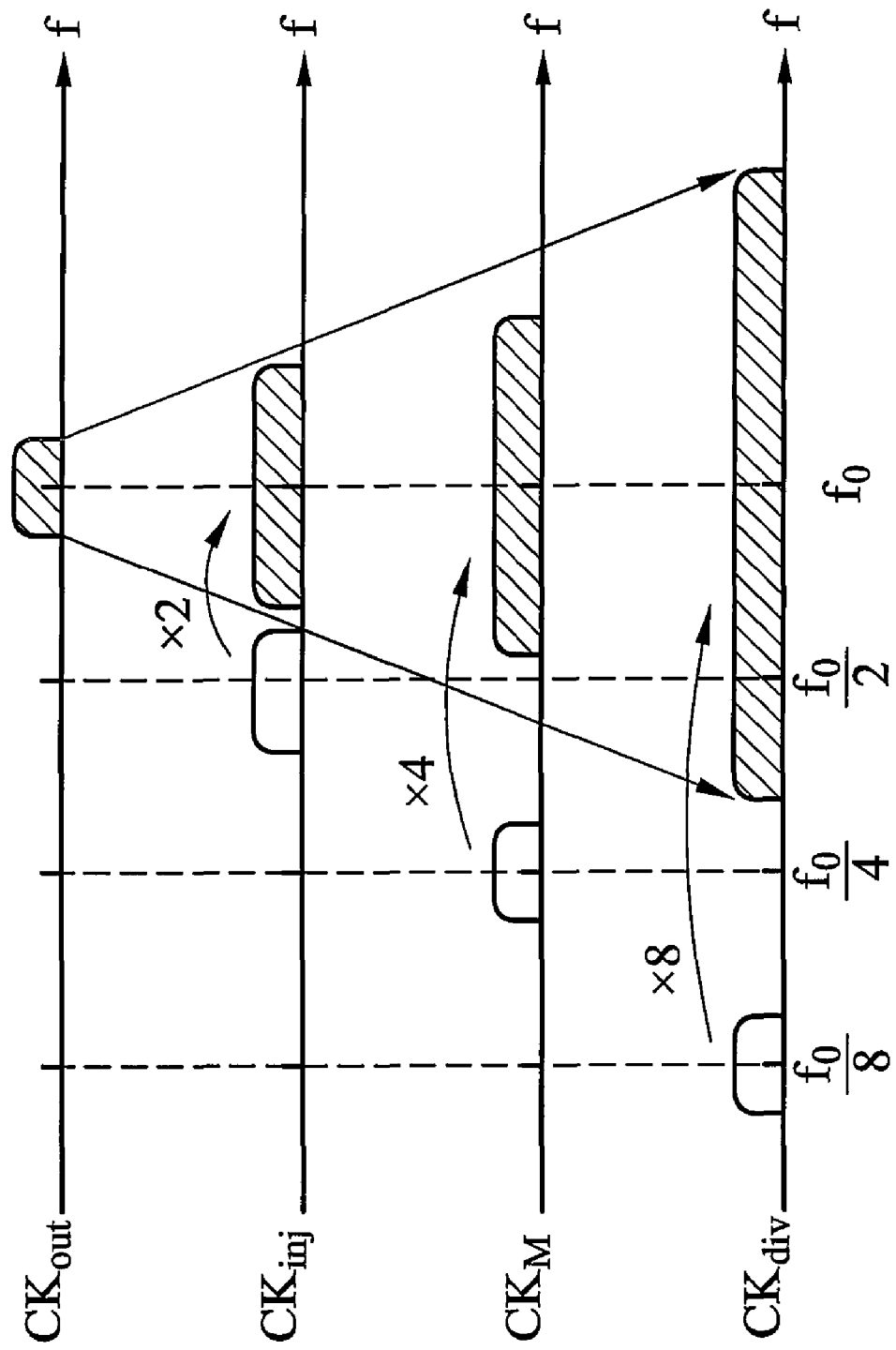
FIG. 3a shows the relationship of frequency divisions and the required locking range for each division.

Now refer to FIG. 3a, showing the relationship of frequency divisions and the required locking range for each division. Each divider has an operating range as wide as the VCO tuning range, and division is perform on the locking range centered at VCO output frequency $f_o$. The normalized locking range increases with the degree of frequency division, consequently a divide-by-8 frequency division requires at least 8 times locking range than that of a VCO output signal $CK_{OUT}$. Further, typically twice of the locking range requirement is provided for taking the effects of PVT (process, voltage, temperature) variation and routing parasitic loading into the design consideration, wherein both can lead to considerable frequency shift in VCO output signal $CK_{OUT}$. For example, a 20 µm routing path of metal4 corresponds to 1-2-fF parasitic capacitance, causing the center frequency of the first division stage deviating 300-500 MHz from the target locking range.

Figure 1:
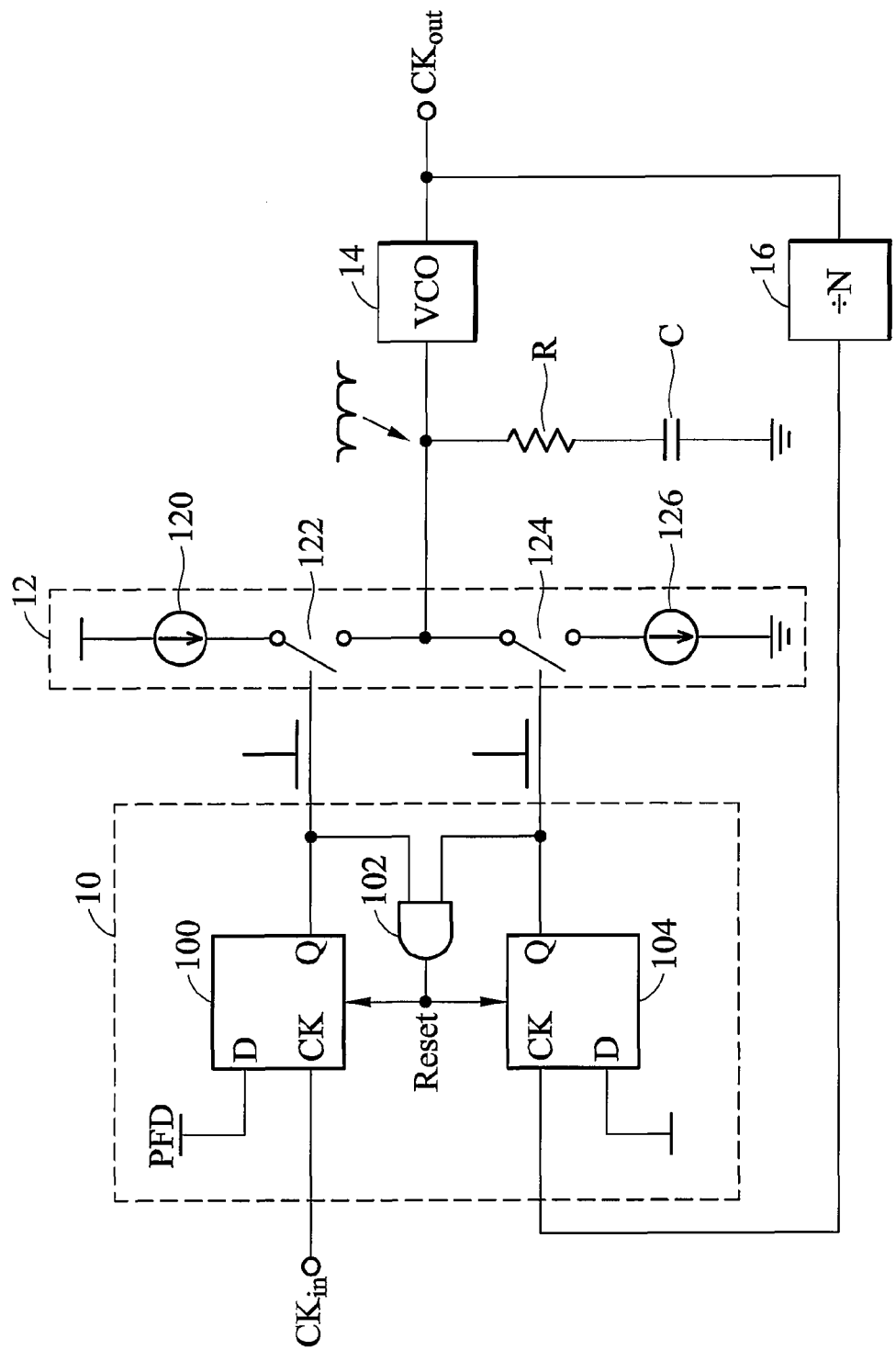
FIG. 1 is a block diagram of a conventional Phase-Locked Loop (PLL).
Figure 3B:
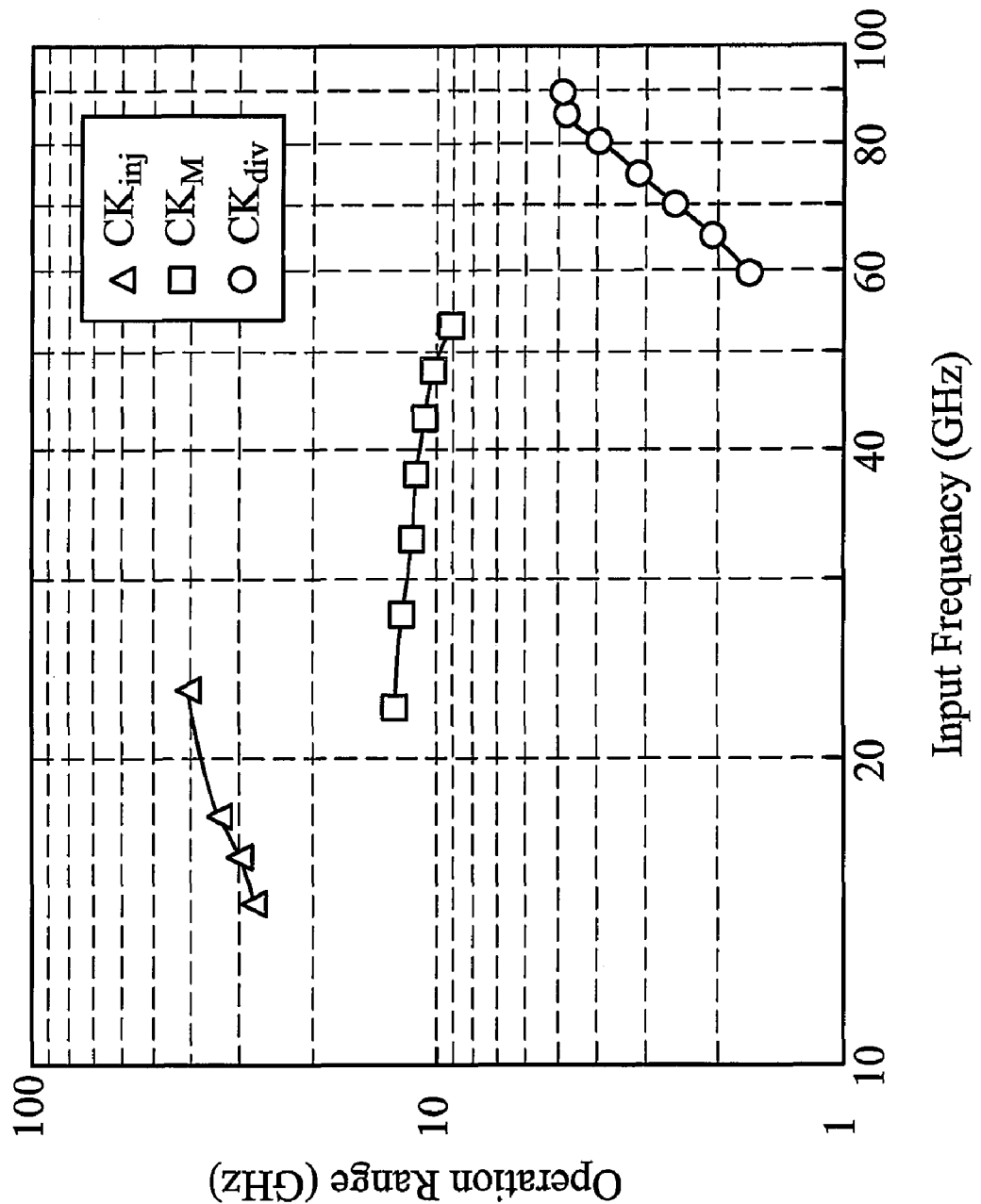
FIG. 3b shows the relationship of operating ranges with respect to input frequency $f_o$ for different types of frequency dividers.

FIG. 3b shows the relationship of operating ranges with respect to input frequency $f_o$ for different types of frequency dividers. Injection locked dividers, Miler dividers, and static dividers are capable of providing 5%, 25%, and 150% of the input frequency $f_o$ for each operating range. In other words, Miller and static frequency dividers offer more flexible operating ranges than Injection locked dividers, thus 3-stage frequency divider 28 utilizes them at the last two division stage. Injection locked divider 280, Miller divider 282, and static divider 284 are implemented by current mode logic (CML) to provide reduced power consumption. 3-stage frequency divider 28 may further include a class-AB static CML frequency divider (not shown in FIG. 1) between Miller divider 282 and static divider 284 to speed up the frequency division operation by removing the tail currents and using the gate control for switching.

Figure 4B:
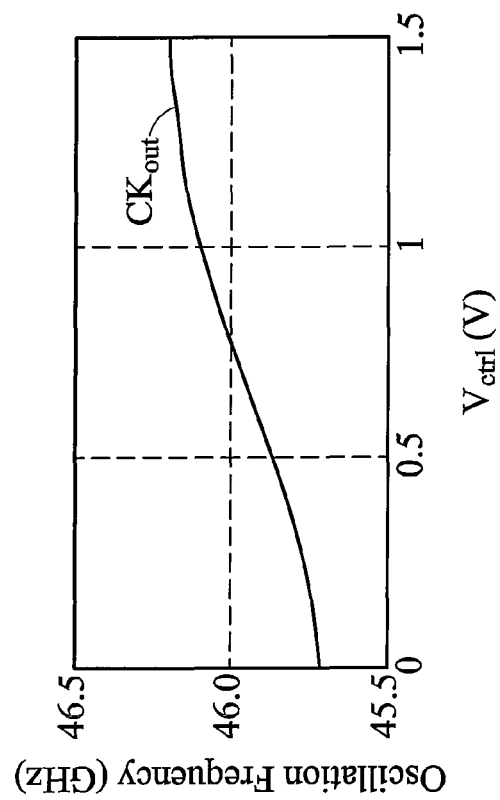
Figure 4A:
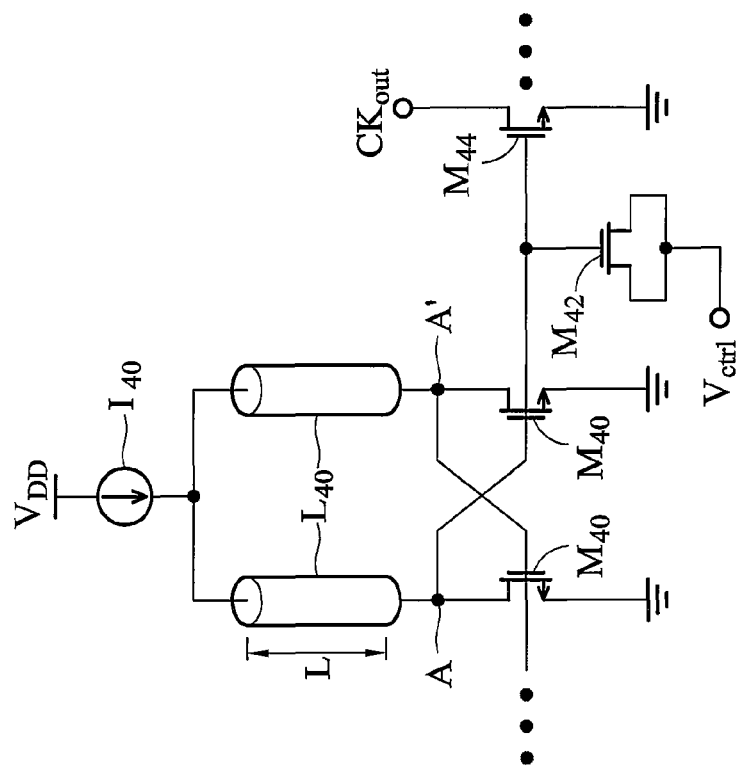
FIG. 4a is a circuit schematic of an exemplary Voltage controlled oscillator (VCO) according to the invention, incorporated in FIG. 2.

FIG. 4a is a circuit schematic of an exemplary Voltage controlled oscillator (VCO) according to the invention, incorporated in FIG. 2, comprising current source 140, transmission line pair L40, cross-coupled transistor pair M40, and transistors M42 and M44. Current source 140 is coupled to transmission line pair L40, cross-coupled transistor pair M40, and subsequently to transistors M42 and M44.

Transmission line pair L40 is modeled as a short-circuited quarter-wavelength ($\lambda/4$) resonator, regardless of whether the oscillating "tube" is indeed a transmission line. The VCO oscillates at a frequency such that the wavelength thereof is 4 times that of the equivalent length L of the transmission line, leaving ends A and A' coupled to cross-coupled transistor pair M40 with maximum swings. Transistor M42 serves as a varactor, varying the capacitance and VCO output frequency $f_o$ of VCO output signal $CK_{OUT}$ by Vctrl. Transistor M44 is a buffer providing VCO output signal $CK_{OUT}$ to external circuits and the feedback path. The device dimensions (width/length) for transistor pair M40, transistors M42 and M44 in FIG. 4(a) are 8/0.1, 2/0.1, and 6/0.1, respectively. As resonance frequency $f_o$ increases, the loading of varactor M42, buffer M44, and dividers (not shown) becomes comparable to that of the cross-coupled pair, limiting maximal frequency of VCO output frequency $f_o$. FIG. 4b shows the relationship of Vctrl and the output frequency of VCO output signal $CK_{OUT}$, incorporating the VCO in FIG. 4a. With the device dimensions provided for the transistors, the maximal output frequency of the VCO circuit is only approximately 46 GHz. The device sizes provided herein are at minimal dimensions, as further miniaturization may cause significant swing degradation.

FIG. 5a is a circuit schematic of another exemplary VCO according to the invention, comprising current source 140, transmission line pair L50, cross-coupled transistor pair M40, and transistors M42 and M44. Current source 140 is coupled to transmission line pair L50, cross-coupled transistor pair M40, and subsequently to transistors M42 and M44.

To counter the loading problem and increase the VCO output frequency for the VCO in FIG. 4a, a transmission line with an equivalent length of three-quarter wavelength of the VCO output is introduced, distributing the loading and increase the VCO output frequency. Transmission line pair L50 has equivalent length 3L, each is short-circuited at one end and open-circuited at the other end, and provides VCO output signal $CK_{OUT}$ with an initial VCO wavelength, such that equivalent length 3L of the transmission line pair is three quarter of the initial VCO wavelength. Cross-coupled transistor pair M40 is coupled to one third of length 3L from the short circuited end. And varactor M42 is coupled to the open-circuited ends of transmission line pair L50, adjusts the initial VCO wavelength of the VCO output signal according to control voltage Vctrl to output VCO wavelength.

Cross-coupled transistor pair M40 provides negative resistance to compensate energy loss in the resonator L50. Cross-coupled transistor pair M40 drives transmission line L50 to produce peak swings at nodes A and A'. The differential signals at nodes A and A' propagate along transmission line pair L50, and reflect at the open-circuited ends to form peak swings at nodes B and B'. The waveforms at nodes A and B (or A' and B') are 180° out of phase. The loading of varactor M42, buffer M44, and dividers (not shown) are removed from nodes A and A', so that the VCO output frequency is driven up to around 75 GHz using the same device dimensions as for the VCO in FIG. 4a, increasing the VCO output frequency without extra power dissipation. FIG. 5b shows the relationship of control voltage $V_{ctrl}$ and the output frequency of VCO output signal $CK_{OUT}$, incorporating the VCO in FIG. 5a. The VCO output frequency increases from 74 to 74.5 GHz as control voltage Vctrl increases from 0 to 1.5V.

Although varactor M42 is connected to nodes B and B', cross-coupled pair M40 is still be able to observe the loading variation at the far ends through the 2L length of the transmission lines. Since the resonance frequency (VCO initial frequency) is determined by the inductance of the first one-third transmission line segment and equivalent capacitance associated with nodes A and A', the tuning of the VCO results in approximately linear increasing, similar to that of a conventional LC tank VCO. A stand-alone VCO with identical circuit implementation disclosed herein is developed for verification. From the measurement taken from the stand-alone VCO circuit, a constant increase of 800 MHz in the VCO output frequency is measured across 1.2 V control voltage Vctrl.

Figure 6:
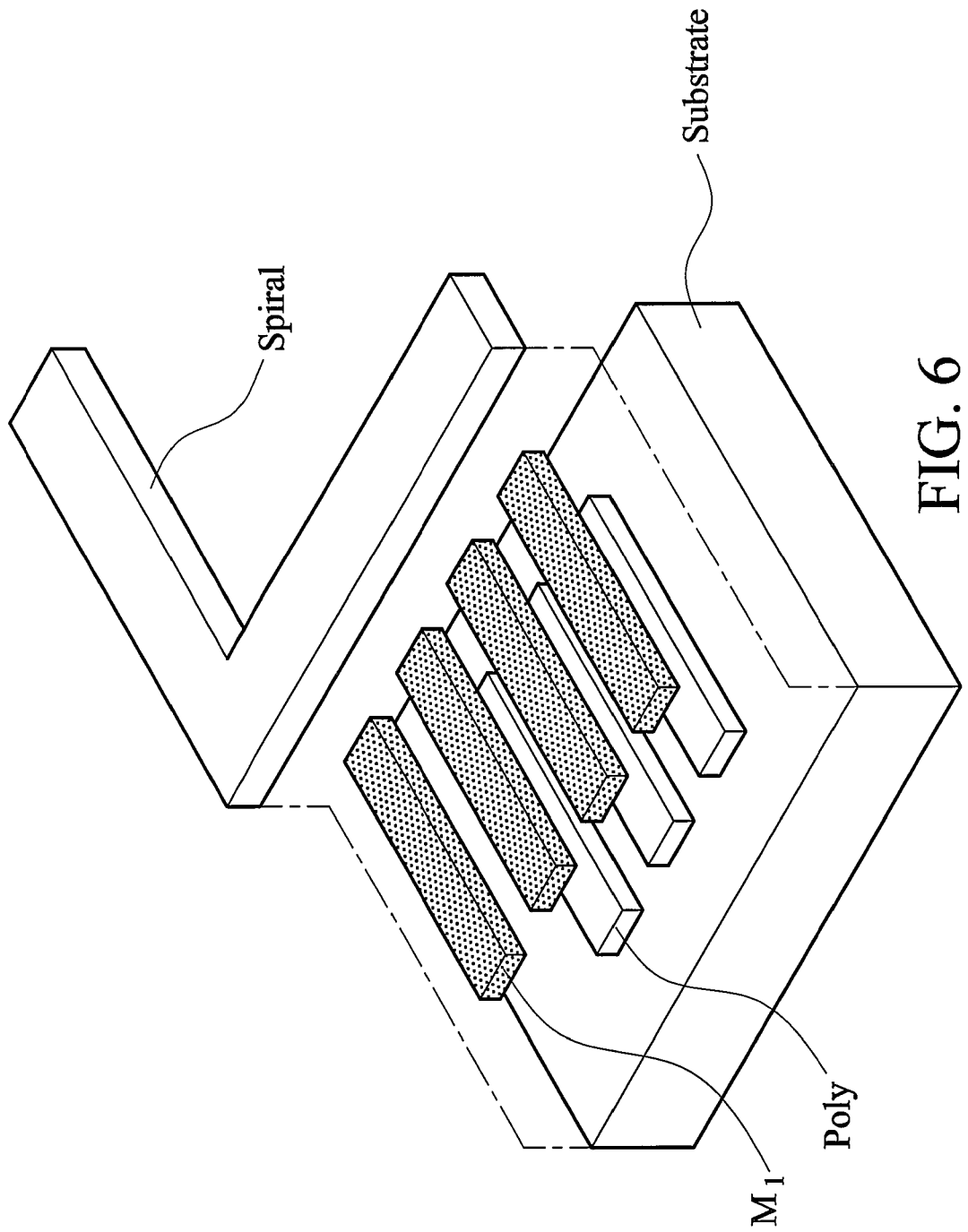

To achieve high Q and compact layout, the transmission lines are realized by three identical inductors in series. FIG. 6 shows a layout arrangement of a ground shield for the transmission lines in the VCO in FIG. 5a. Two layers of ground shield comprise polysilicon Poly and metal1 M1 are placed alternately underneath the spirals (the transmission lines). Since the gaps between the spirals and the substrate are filled, the electric field lines are confined between the spiral and the shields, minimizing the capacitive coupling to the substrate and increase Q factor of the inductor. Simulation indicates the Q factor of the inductor of the VCO is 16 at 75 GHz.

Figure 7A:
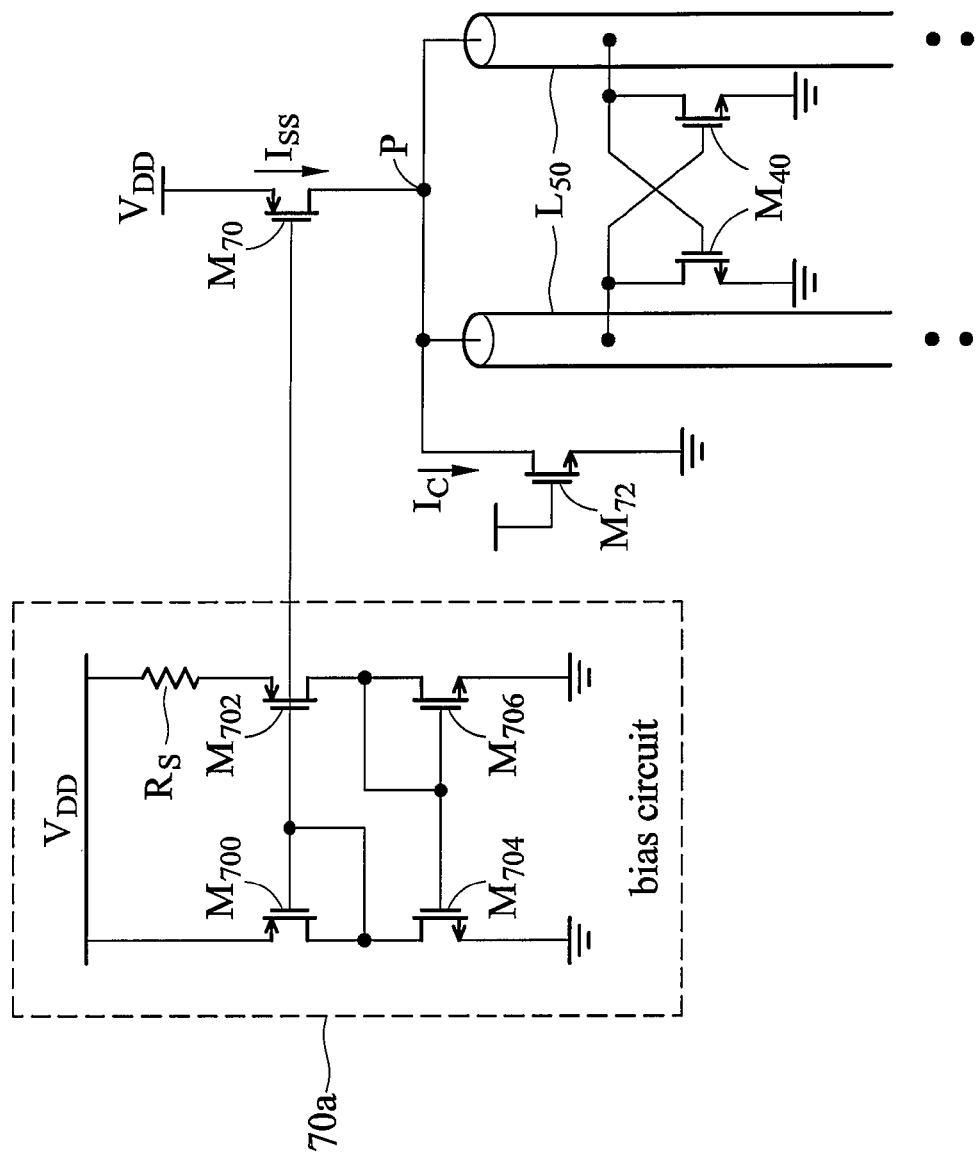
FIG. 7a is a circuit schematic of still another exemplary VCO according to the invention.

FIG. 7a is a circuit schematic of still another exemplary VCO according to the invention, comprising bias circuit 70a, transistors M70 and M72, transmission lines L50, and cross-coupled transistor pair M40. Bias circuit 70a is coupled to transistor M70, subsequently coupled to transistor M72, transmission lines L50 and cross-coupled transistor pair M40.

Figure 7B:
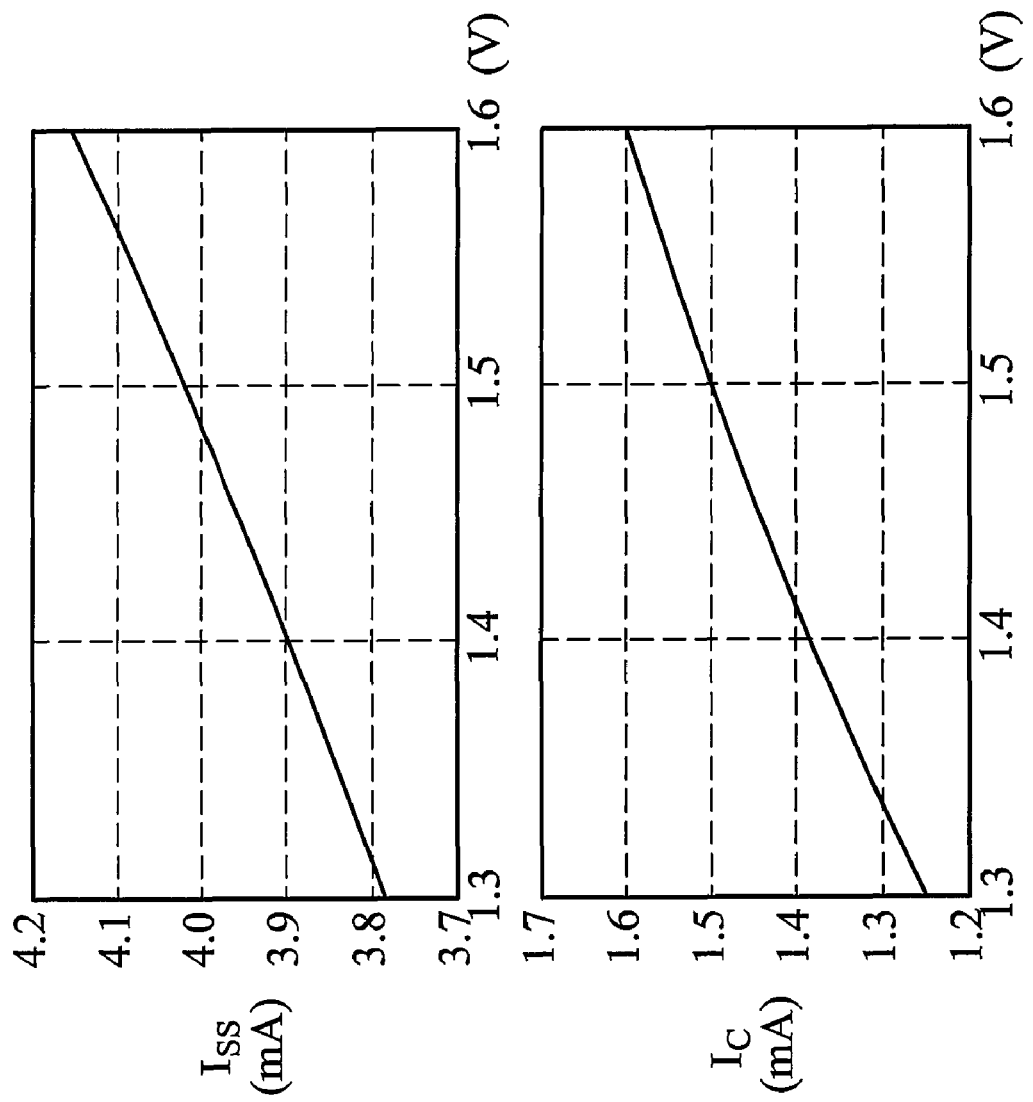
Figure 7C:
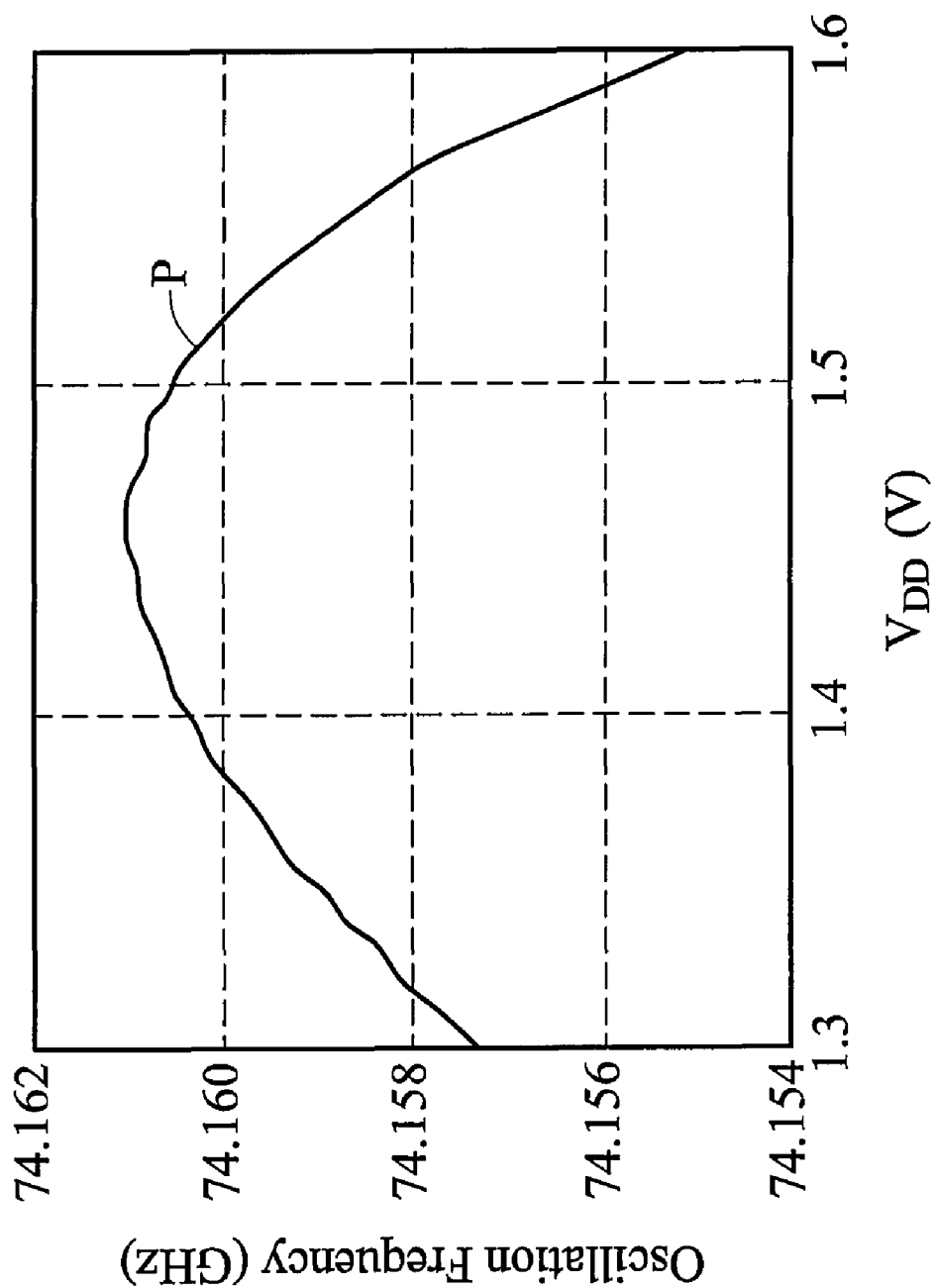

To suppress the coupling from power lines, the VCO is biased with supply-independent circuit 70a, comprising transistors M700 through M706, and resistor $R_S$. Transistors M700 and M702, and M704 and M706 are current mirrors, such that the drain currents through transistors M700 through M706, and transistor M70, are only determined by device dimensions thereof, independent of supply voltage $V_{DD}$. Transistor M72 is introduced to absorb extra current variation in transistor M70 due to channel-length modulation to further reject the supply noise. By proper device sizing we set:

$$\left| \frac{\delta I_{ss}}{\delta V_{DD}} \right| = \left| \frac{\delta I_C}{\delta V_{DD}} \right| \tag{1}$$

where $V_{DD}$ is the supply voltage, $I_{SS}$ is the drain current through transistor M70, and $I_C$ is the drain current through transistor M70. FIG. 7b shows the relationship of supply voltage $V_{DD}$ and drain currents $I_{SS}$ and $I_C$. FIG. 7b suggests an identical slope for drain currents $I_{SS}$ and $I_C$ when supply voltage $V_{DD}$ varies, thus the channel-length modulation current in $I_{SS}$ is compensated by $I_C$, the rest of the current flowing into the transmission lines remains constant, and the VCO resonance frequency is insensitive to supply perturbation, as in FIG. 7c, depicting the relationship of supply voltage $V_{DD}$ and the oscillation frequency of the VCO in FIG. 7a. The power consumption of compensation transistor M72 can be restrained to as low as 20-30%.

Figure 8:
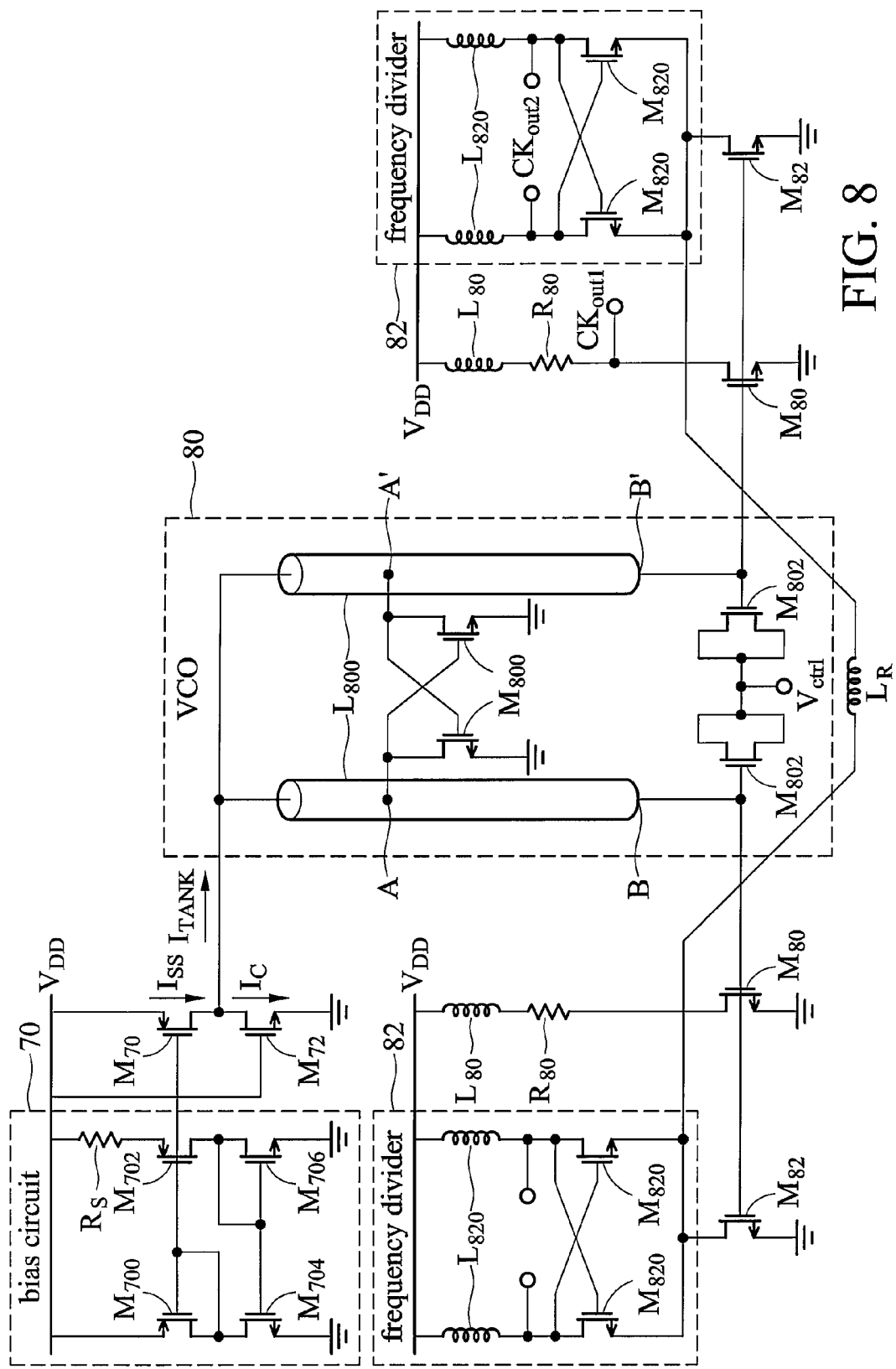
FIG. 8 is a circuit schematic of yet another exemplary VCO according to the invention.

FIG. 8 is a circuit schematic of yet another exemplary VCO according to the invention, comprising bias circuit 70, VCO circuit 80, frequency dividers 82, inductors L80, resistors R80, buffer transistors M80 and M82, and compensation inductor $L_R$.

The description for bias circuit 70 and VCO circuit 80 are provided in the circuits of FIGS. 7a and 5a. A natural bias is established by cross-coupled transistor pair M800 to facilitate dc coupling between VCO circuit 80 and external circuits or the feedback path. Frequency dividers 82 are the first division stage, implemented by injection locked frequency dividers. Two identical injection locked dividers 82 are used to preserve symmetry, one generates 37.5 GHz VCO output signal $CK_{out}$ to the second divider stage, and the other provides a half-rate clock output for testing purpose. Dummy buffer M80 is used along with careful layout to provide a loading balance between the loading at nodes B and B'. Inductor $L_R$ is included to cancel out the parasitic capacitance associated with nodes C and C', allowing stronger signal injection through transducer amplifiers M82.

Figure 9:
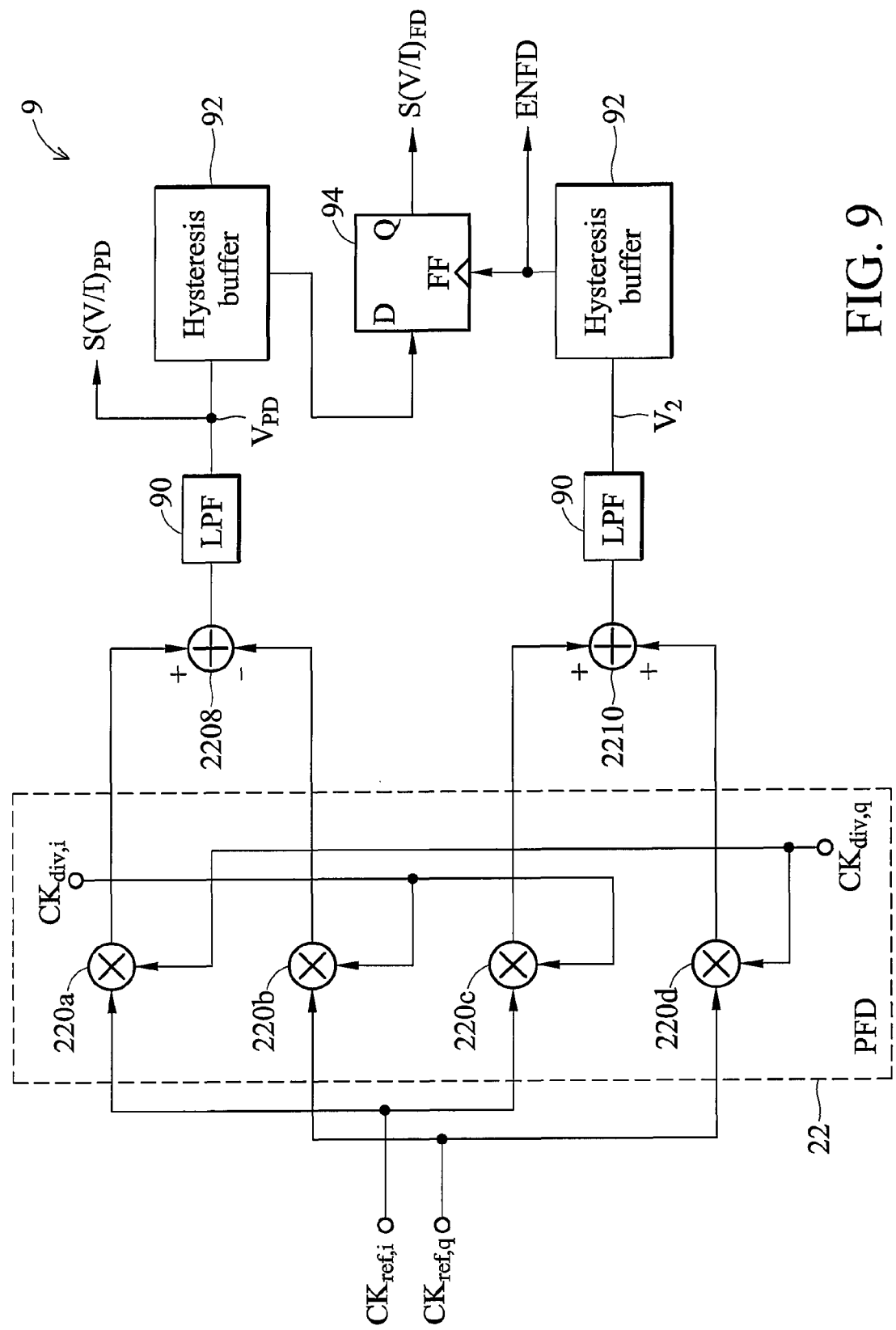
FIG. 9 is a block diagram of an exemplary phase and frequency detector (PFD) according to the invention.

FIG. 9 is a block diagram of an exemplary phase and frequency detector (PFD) according to the invention, comprising phase-frequency detector 22, loop filters 90, hysteresis buffers 92, and flip-flop 94. Phase-frequency detector 22 is coupled to loop filters 90, hysteresis buffers 92, and then to flip-flop 94.

Phase and frequency detector (PFD) uses single sideband mixers to realize phase and frequency detection between reference signals $CK_{ref,i}$, $CK_{ref,q}$ and feedback signals $CK_{div,i}$, $CK_{div,q}$ and produce phase error $V_{PD}$ and frequency error $V_{FD}$, controlling control voltage Vctrl to adjust the output frequency of the VCO such that the phase and frequency errors are reduced. In the embodiment, the phase detection and frequency detection are integrated into one circuit to reduce circuit complexity, circuit dimension, and manufacturing cost. The single sideband approach reduces signal interference of reference spurs resulting from the charge pump approaches in the PFD in FIG. 1.

Figure 10B:
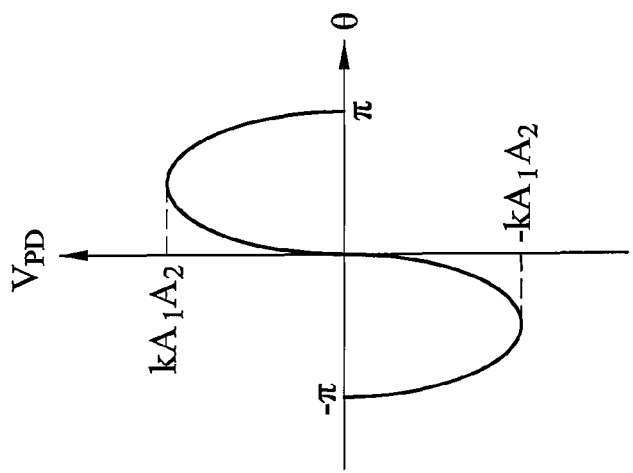
Figure 10A:
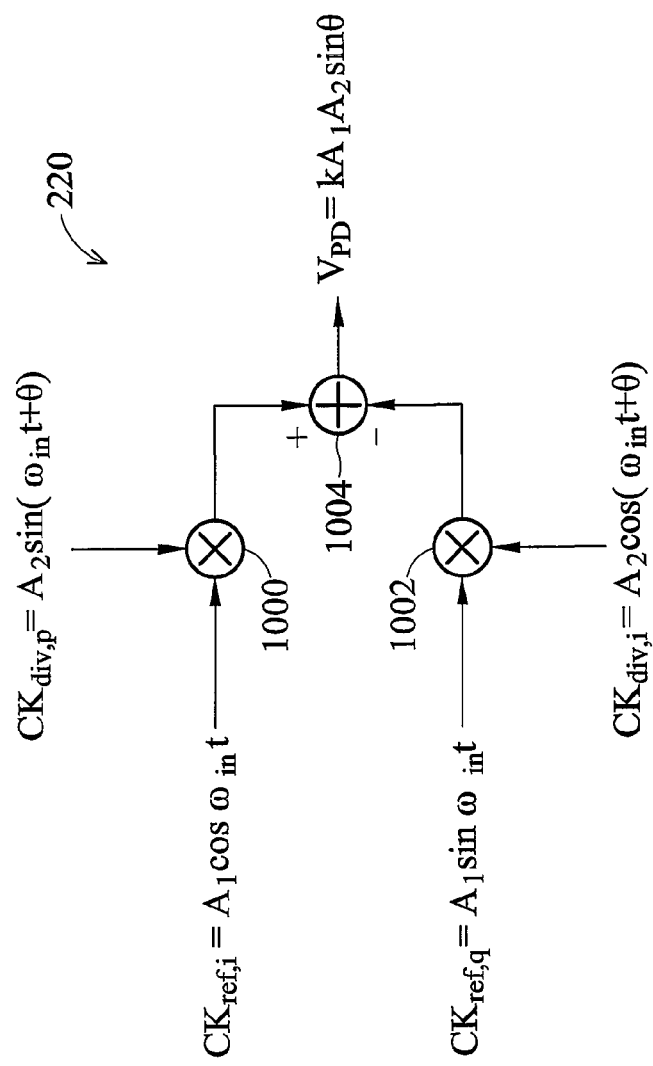
FIG. 10a is a block diagram of an exemplary phase detector in FIG. 9.

FIG. 10a is a block diagram of an exemplary phase detector in FIG. 9, comprising mixers 1000, 1002, and adder 1004. Mixers 1000 and 1002 are coupled to adder 1004 to produce phase error $V_{PD}$.

Phase detector 220 is a single sideband mixer, in which mixer 1000 multiplies quadrature signal $CK_{ref,q}$ of the reference signal with in-phase signal $CK_{div,i}$ of the feedback signal to generate a first multiplication output, mixer 1002 multiplies in-phase signal $CK_{ref,i}$ of the reference signal with quadrature signal $CK_{div,q}$ of the feedback signal to generate a second multiplication output, and adder 1004 adding the first multiplication output with a negation of the second multiplication output to generate phase error $V_{PD}$.

To prevent on-off pulses that produces reference spurs, the phase detection is performed by mixing the orthogonal components of the reference and feedback signals. A single sideband (SSB) mixer is employed to extract the phase error between the reference and feedback signals, rendering phase detector signal $V_{PD}$ that exhibits a sinusoidal relationship with the actual phase error θ between the reference and feedback signals. FIG. 10b depicts the relationship of phase detector voltage $V_{PD}$ and error θ, incorporating the phase detector in FIG. 10a. Referring to FIG. 10b, since the waveform characteristic can be approximated to a linear relationship in the vicinity of origin, phase error θ is computed according to phase detector voltage $V_{PD}$. By utilizing the SSB mixer in FIG. 10a and the relationship in FIG. 10b, no pulse generation is involved in phase detection, resulting in a "quiet" phase examination and reducing reference spurs significantly.

Next, PD voltage-to-current converter 224 obtains phase error θ for current conversion proportional thereto, and outputs a positive or negative converted phase error current to loop filter 24, which accordingly generates control voltage Vctrl. The current imbalance in PD voltage-to-current converter 224 is no longer an issue, since phase detector phase detector 220 creates an offset between the reference and feedback signals to compensate the offset.

Figure 10C:
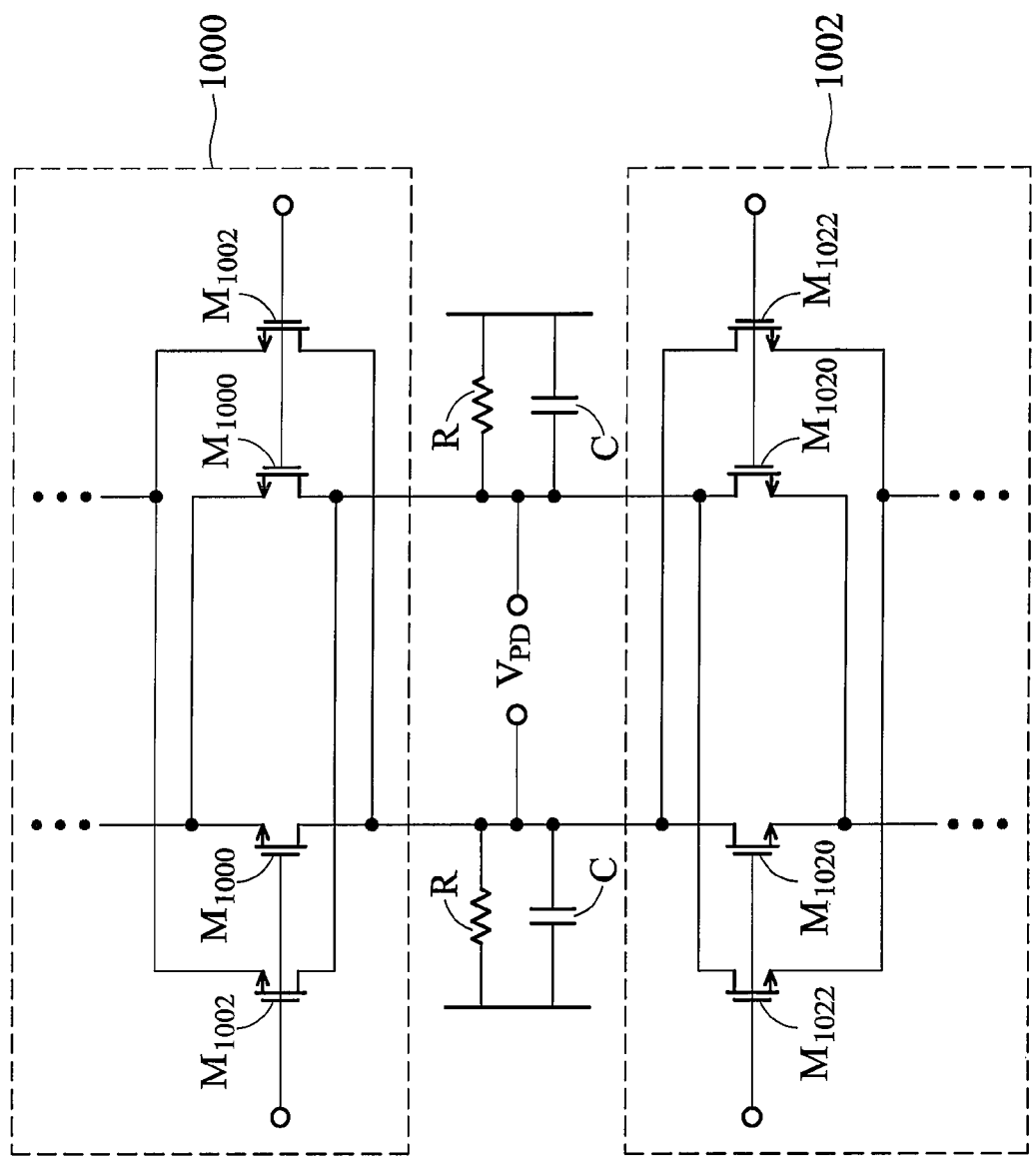

In the presence of mismatches, finite "image" signal is observed at twice of the reference frequency of reference signals $CK_{ref,i}$ and $CK_{ref,j}$, and a low pass filter is inserted after the SSB mixer to suppress the image signal. FIG. 10c is a circuit schematic of an exemplary phase detector capable of suppressing the image signal, comprising mixers 1000, 1002, resistors R and capacitors C. The phase detector circuit in FIG. 10c is realized by loading the SSB mixer with an RC network, for example, R=600Ω, C=32 pF, generating a corner frequency of 8.3 MHz and reject the image signal by more than 40 dB. The low-pass filter has little impact on the overall loop bandwidth, operated at around 2-3 MHz. The phase detector circuit in FIG. 10c reveals a minimum ripple of only 15 V.

Figure 11:
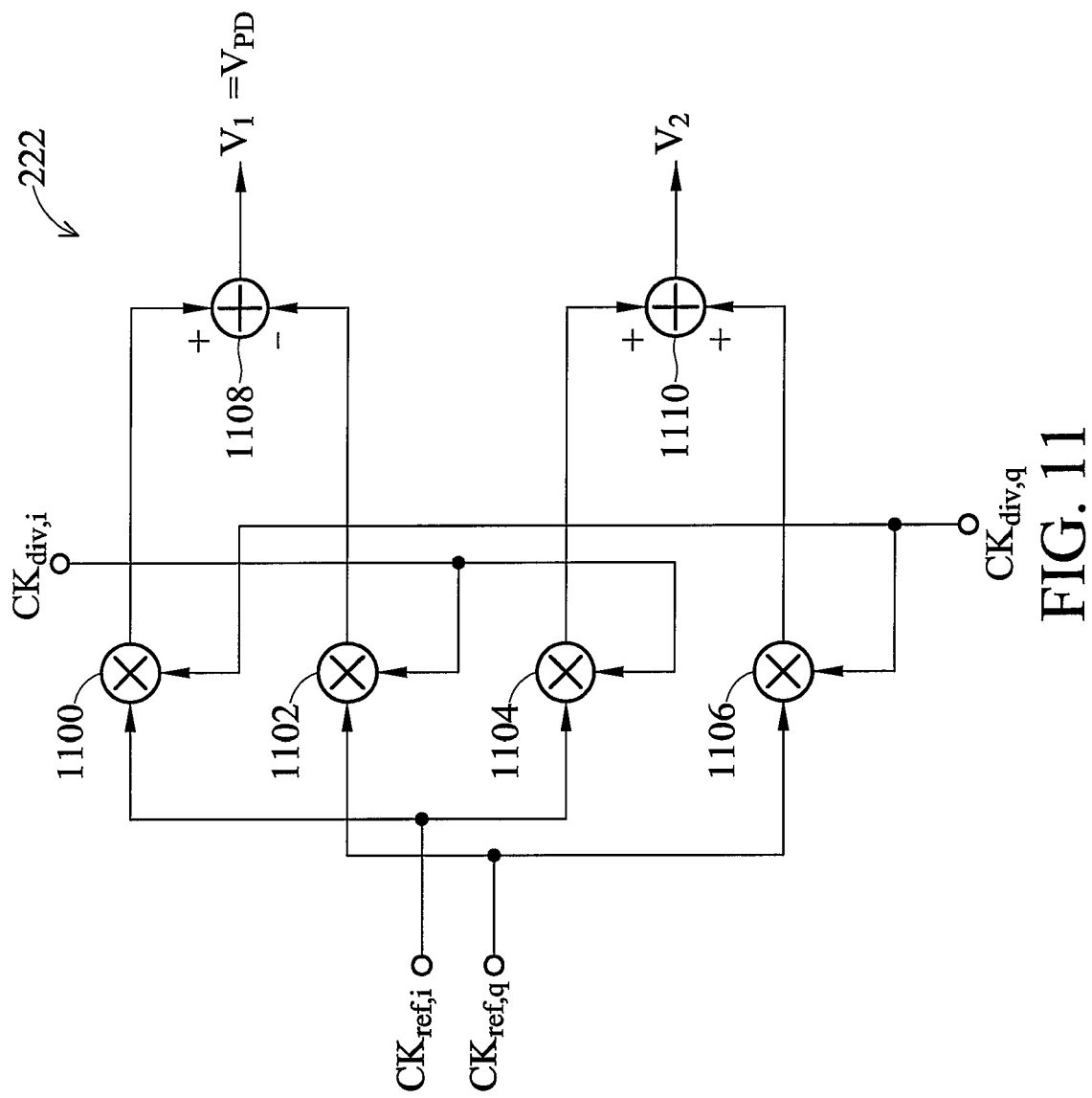
FIG. 11 is a block diagram of an exemplary frequency detector in FIG. 9.

FIG. 11 is a block diagram of an exemplary frequency detector in FIG. 9, comprising mixers 1100, 1102, 1104, and 1106, and adders 1108 and 1110. Mixers 1100 and 1102 are coupled to adder 1108. Mixers 1104 and 1106 are coupled to adder 1110.

Mixer 1100 multiplies the quadrature signal of the reference signal with the in-phase signal of the feedback signal to generate a first multiplication output. Mixer 1102 multiplies the in-phase signal of the reference signal with the quadrature signal of the feedback signal to generate a second multiplication output. Adder 1108 adds the first multiplication output with a negation of the second multiplication output to generate first SSB output $V_{PD}$. Mixer 1104 multiplies the in-phase signal of the reference signal with the in-phase signal of the feedback signal to generate a third multiplication output. Mixer 1106 multiplies the quadrature signal of the reference signal with the quadrature signal of the feedback signal to generate a fourth multiplication output. Adder 1110 adds the first multiplication output with the second multiplication output to generate second SSB output $V_2$. A flip-flop (not shown), coupled to the first and second FD adders, latches first SSB output $V_{PD}$ by second SSB output $V_2$ to generate FD error $V_{FD}$.

Frequency detector 222 is implemented by two SSB mixers. First SSB output $V_{PD}$ also serves as the phase detector signal in phase detector circuit phase detector 220. First SSB output $V_{FD}$ and second SSB output $V_2$ are orthogonal in the presence of frequency error $\Delta\omega_{in}$:

$$V_{PD} = kA_1 A_2 \sin(\Delta\omega_{in} t + \theta) \quad (2)$$

$$V_2 = kA_1 A_2 \cos(\Delta\omega_{in} t + \theta) \quad (3)$$

Where $\Delta\omega_{in}$ is a frequency difference between reference signal $CK_{ref}$ and feedback signal $CK_{div}$, k is a mixer gain of the SSB mixer, $A_1$ is an amplitude of reference signal $CK_{ref}$, $A_2$ is an amplitude of reference signal $CK_{div}$, θ is the phase error. Whether first SSB output $V_{PD}$ leads or lags second SSB output $V_2$ is determined by the sign of frequency error $\Delta\omega_{in}$. The flip-flop latches first SSB output $V_{PD}$ by second SSB output $V_2$ to sample one signal with the other to obtain the sign of frequency error $\Delta\omega_{in}$. Based on the flip-flop's output, V/I converter (V/I)$_{FD}$ FD voltage-to-current converter 226 injects a positive or negative FD current to loop filter 24. The FD current is 3 times larger than the peak current of V/I converter (V/I)$_{PD}$ PD voltage-to-current converter 224 to provide a smooth frequency acquisition. To reduce the disturbance to control voltage Vctrl, the automatic switching-off function of frequency detector 222 and FD voltage-to-current converter 226 is provided in this design by applying signal ENFD to (V/I)$_{FD}$ FD voltage-to-current converter 226, disabling frequency detector 222 and FD voltage-to-current converter 226 upon frequency locked up to reduce power consumption and increase signal stability.

Figure 12A:
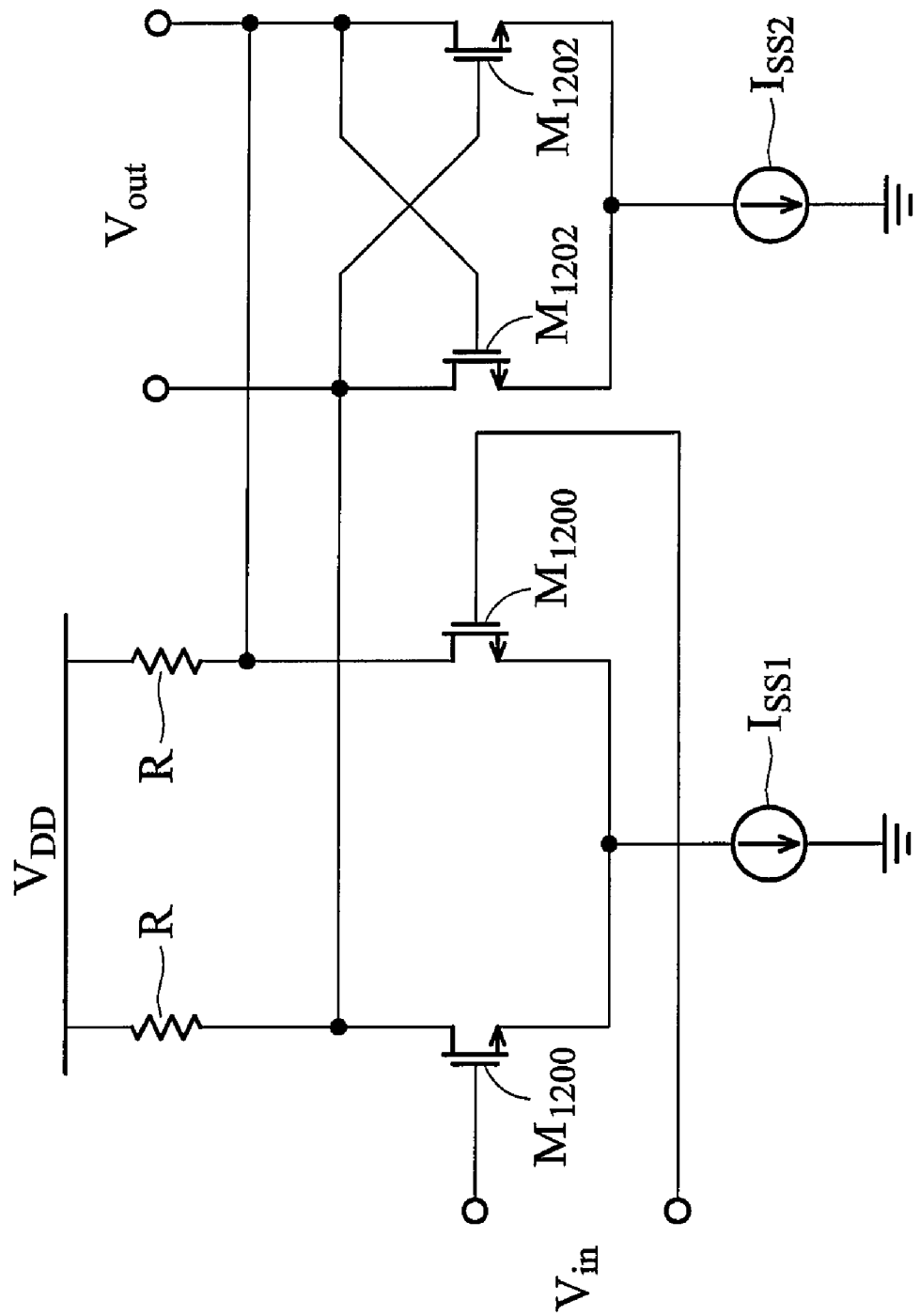
FIG. 12a is a circuit schematic of an exemplary hysteretic buffer in FIG. 9.
Figure 12B:
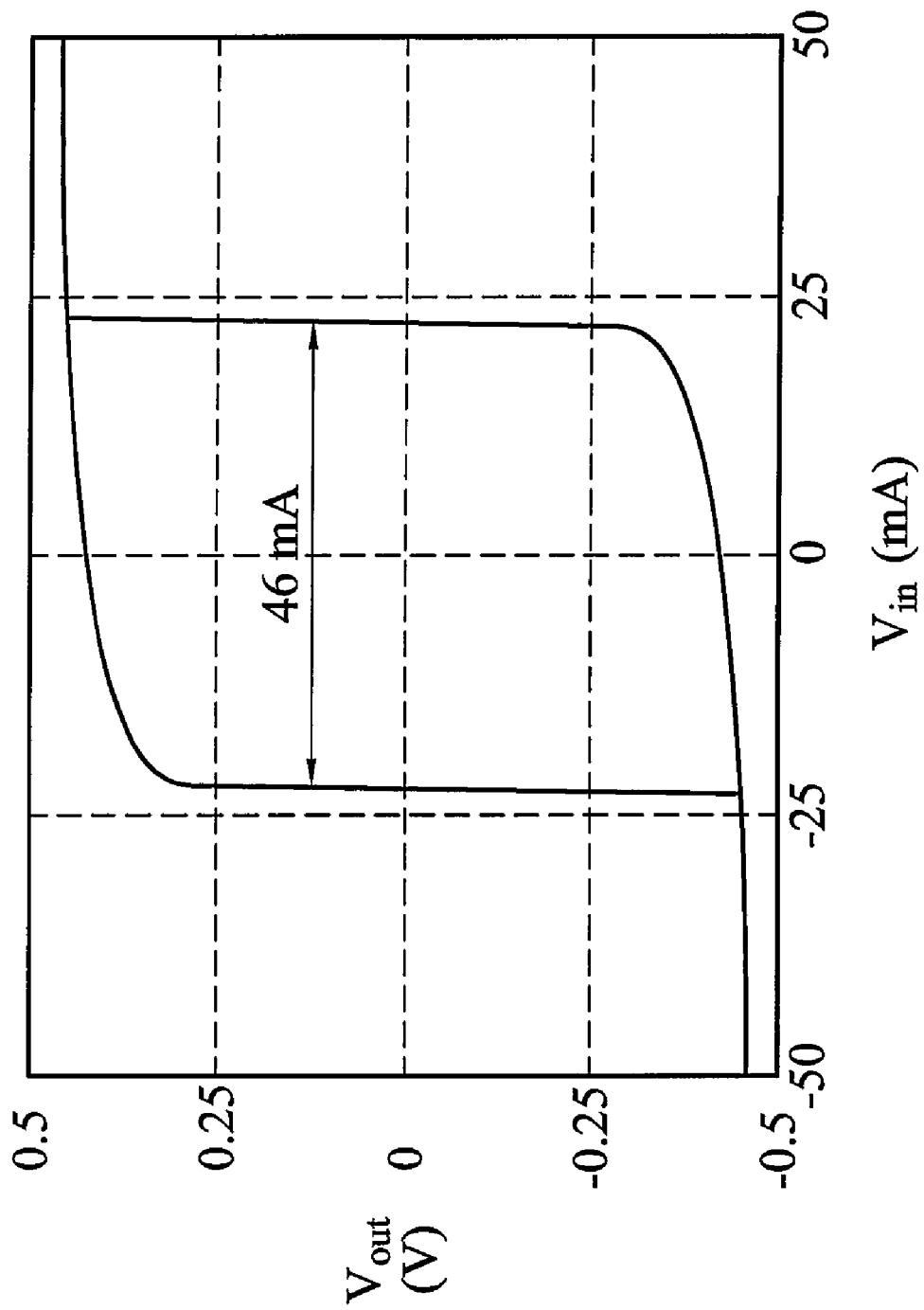

When the frequencies of reference signal $CK_{ref}$ and feedback signal $CK_{div}$ are close, the sinusoidal SSB output $V_{PD}$ and second SSB output $V_2$ becomes very slow, which may cause malfunction of the flip-flop if they drive the flip-flop directly, because the transitions signal $CK_{ref}$ and feedback signal $CK_{div}$ become extremely slow when the loop is close to be locked. The transient fluctuation caused by unwanted coupling or additive noise would make the transitions ambiguous, possibly resulting in false multiple zero crossings at the output of the flip-flop. To counter this problem, hysteresis buffers are employed to sharpen the waveforms. FIG. 12*a* is a circuit schematic of an exemplary hysteretic buffer in FIG. 9, comprising cross-coupled transistor pairs M1200 and M1202, resistors R, and current sources $I_{SS1}$ and $I_{SS2}$. The cross-coupled pair M1202 provides different switching thresholds for low-to-high transition LH and high-to-low HL transition, and the positive feedback helps to create square waves as well. In the embodiment, the aspect ratio of the device $(W/L)_{M1200}=(W/L)_{M1200}=8/0.25$, and a threshold difference of 46 mV is provided in FIG. 12*b*, showing the relationship of input voltage $V_{in}$ and output voltage $V_{out}$ for the phase detector in FIG. 10*a*.

The frequency detector 222 in FIG. 11 may further comprises first and second hysteresis buffers. The first hysteresis buffer is coupled to adder 1108 and the flip-flop, outputs a "HIGH" voltage to the data port of the flip-flop when phase error θ exceeds a first LH threshold, and outputs a "LOW" voltage to the data port of the flip-flop when phase error θ is less than or equals to a first HL threshold. The first LH threshold exceeds the first HL threshold. The second hysteresis buffer is coupled to FD adder 1110 and the flip-flop, outputs a "HIGH" voltage to the clock port of the flip-flop when the frequency error exceeds a second LH threshold, and outputs a "LOW" voltage to the clock port the flip-flop when the frequency error is less than or equals to a second HL threshold. Again, the second LH threshold exceeds the second HL threshold.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop, comprising:
    a phase-frequency detector (PFD), receiving a reference signal and a feedback signal to determine phase and frequency errors;
    a loop filter, coupled to the phase-frequency detector, filtering the phase and frequency errors to generate a control voltage;
    a voltage controlled oscillator (VCO), coupled to the loop filter, generating a VCO output signal according to the control voltage, comprising:
        a transmission line pair, having a length, short-circuited at one end pair and open-circuited at the other end pair, providing the VCO output signal with an initial VCO wavelength;
        a cross-coupled transistor pair, directly connected to one third of the length of the transmission line pair from the short circuited end pair; and
        a varactor, coupled to the open-circuited ends of the transmission line pair, adjusting the initial VCO wavelength of the VCO output signal according to a control voltage to a final VCO wavelength, wherein the length of the transmission line pair is three quarter of the initial VCO wavelength; and
    a 3-stage frequency divider, coupled to the voltage controlled oscillator, dividing the frequency of the VCO output signal 3 times to generate the feedback signal.

2. The phase locked loop of claim 1, wherein the 3-stage frequency divider comprises:
    an injection locked divider, a Miller divider, and a static divider, coupled to one another in this sequence.

3. The phase locked loop of claim 1, wherein the voltage controlled oscillator further comprises:
    a bias circuit, providing a bias voltage independent to a supply voltage of the VCO;
    an active load, coupled to the bias circuit and the transmission line pair, receiving the bias voltage to provide a supply current independent of the supply voltage to the transmission line pair; and
    a transistor, coupled to the active load and the transmission line pair, compensating a voltage variation of the supply current due to the channel-length modulation to generate a compensated current.

4. The phase locked loop of claim 1, wherein the varactor is a MOS transistor having a gate, a drain, and a source, the gate is coupled to open-circuited end of the transmission line, and the drain and source are coupled together to receive the control voltage.

5. The phase locked loop of claim 1, wherein the reference signal and a feedback signal have orthogonal signal pairs, and phase-frequency detector comprises a phase detector, receiving the orthogonal signal pairs of the reference signal and the feedback signal, comprising:
    a first PD multiplier, multiplying the quadrature signal of the reference signal with the in-phase signal of the feedback signal to generate a first multiplication output;
    a second PD multiplier, multiplying the in-phase signal of the reference signal with the quadrature signal of the feedback signal to generate a second multiplication output; and
    a PD adder, coupled to the first and second PD multipliers, adding the first multiplication output with a negation of the second multiplication output to generate a phase error.

6. The phase locked loop of claim 1, wherein the reference signal and a feedback signal have orthogonal signal pairs, and the frequency detector, receiving the orthogonal signal pairs of the reference signal and the feedback signal, comprising:
    a first FD multiplier, multiplying the quadrature signal of the reference signal with the in-phase signal of the feedback signal to generate a first multiplication output;
    a second FD multiplier, multiplying the in-phase signal of the reference signal with the quadrature signal of the feedback signal to generate a second multiplication output;

a first FD adder, coupled to the first and second PD multipliers, adding the first multiplication output with a negation of the second multiplication output to generate a first SSB output;

a third FD multiplier, multiplying the in-phase signal of the reference signal with the in-phase signal of the feedback signal to generate a third multiplication output;

a fourth FD multiplier, multiplying the quadrature signal of the reference signal with the quadrature signal of the feedback signal to generate a fourth multiplication output;

a second FD adder, coupled to the third and fourth PD multipliers, adding the first multiplication output with the second multiplication output to generate a second SSB output; and a flip-flop, coupled to the first and second FD adders, latching the first SSB output with the second SSB output to generate an FD error.

7. A voltage controlled oscillator, comprising:

a transmission line pair, having a length, short-circuited at one end pair and open-circuited at the other end pair, providing a VCO output signal with an initial VCO wavelength at the open-circuited end pair;

a cross-coupled transistor pair, directly connected to one third of the length of the transmission line pair from the short circuited end pair; and a varactor, coupled to the open-circuited ends of the transmission line pair, adjusting the initial VCO wavelength of the VCO output signal according to a control voltage to a final VCO wavelength, wherein the length of the transmission line pair is three quarters of the initial VCO wavelength.

8. The voltage controlled oscillator of claim 7, wherein the varactor is a MOS transistor having a gate, a drain, and a source, the gate is coupled to open-circuited end of the transmission line, and the drain and source are coupled together to receive the control voltage.

9. The voltage controlled oscillator of claim 7, wherein the voltage controlled oscillator further comprises:

a bias circuit, providing a bias voltage independent to a supply voltage of the VCO;

an active load, coupled to the bias circuit and the transmission line pair, receiving the bias voltage to provide a supply current independent of the supply voltage to the transmission line pair; and a transistor, coupled to the active load and the transmission line pair, compensating a voltage variation of the supply current due to the channel-length modulation to generate a compensated current.

10. A phase locked loop, comprising:

a phase-frequency detector (PFD), receiving a reference signal and a feedback signal to determine phase and frequency errors;

a loop filter, coupled to the phase-frequency detector, filtering the phase and frequency errors to generate a control voltage;

a voltage controlled oscillator (VCO), coupled to the loop filter, generating a VCO output signal according to the control voltage, comprising:

a transmission line pair, having a length, short-circuited at one end pair and open-circuited at the other end pair, providing the VCO output signal with an initial VCO wavelength;

a cross-coupled transistor pair, coupled to one third of the length of the transmission line pair from the short circuited end pair, wherein the cross-coupled transistor pair is coupled to a node pair of the transmission line pair, and the node pair is disposed at one third of the length of the transmission line pair from the short circuited end pair, wherein the cross-coupled transistor pair drives the transmission line pair to produce peak swings at the node pair; and a varactor, coupled to the open-circuited ends of the transmission line pair, adjusting the initial VCO wavelength of the VCO output signal according to a control voltage to a final VCO wavelength, wherein the length of the transmission line pair is three quarter of the initial VCO wavelength; and a 3-stage frequency divider, coupled to the voltage controlled oscillator, dividing the frequency of the VCO output signal 3 times to generate the feedback signal.

11. The phase locked loop of claim 10, wherein the varactor is a MOS transistor having a gate, a drain, and a source, the gate is coupled to open-circuited end of the transmission line, and the drain and source are coupled together to receive the control voltage.

12. A voltage controlled oscillator, comprising:

a transmission line pair, having a length, short-circuited at one end pair and open-circuited at the other end pair, providing a VCO output signal with an initial VCO wavelength at the open-circuited end pair;

a cross-coupled transistor pair, coupled to one third of the length of the transmission line pair from the short circuited end pair; and a varactor, coupled to the open-circuited ends of the transmission line pair, adjusting the initial VCO wavelength of the VCO output signal according to a control voltage to a final VCO wavelength, wherein the cross-coupled transistor pair is coupled to a node pair of the transmission line pair, and the node pair is disposed at one third of the length of the transmission line pair from the short circuited end pair, wherein the cross-coupled transistor pair drives the transmission line pair to produce peak swings at the node pair, wherein the length of the transmission line pair is three quarters of the initial VCO wavelength.

13. The voltage controlled oscillator of claim 12, wherein the varactor is a MOS transistor having a gate, a drain, and a source, the gate is coupled to open-circuited end of the transmission line, and the drain and source are coupled together to receive the control voltage.

* * * * *